United States Patent [19]

Nakagawa

[11] Patent Number: 4,939,052
[45] Date of Patent: Jul. 3, 1990

[54] X-RAY EXPOSURE MASK
[75] Inventor: Kenji Nakagawa, Isehara, Japan
[73] Assignee: Fujitsu Limited, Kawasaki, Japan
[21] Appl. No.: 289,394
[22] Filed: Dec. 15, 1988

Related U.S. Application Data

[63] Continuation of Ser. No. 10,543, Feb. 3, 1987, abandoned.

[30] Foreign Application Priority Data

Feb. 3, 1986 [JP] Japan .................. 61-22562

[51] Int. Cl.$^5$ .................. G03F 1/00
[52] U.S. Cl. .................. 430/5; 430/296; 430/967; 378/35
[58] Field of Search .............. 430/5, 296, 321, 323, 430/324, 967; 428/473.5, 698, 701; 378/35

[56] References Cited

U.S. PATENT DOCUMENTS

| | | | |
|---|---|---|---|
| 3,925,677 | 12/1975 | Fraser | 430/5 |
| 4,018,938 | 4/1977 | Feder et al. | 427/43 |
| 4,549,939 | 10/1985 | Kenworthy et al. | 204/4 |
| 4,696,878 | 9/1987 | Shimkunas | 430/5 |

FOREIGN PATENT DOCUMENTS 58-90729  5/1983  Japan .................. 430/5

OTHER PUBLICATIONS

Patent Abstract of Japan, vol. 9, No. 291 (E-359)(2014) Nov. 19, 1985 & JP-A-60 132323 (Hitachi Seisakusho) Jul. 15, 1985.
Patent Abstracts of Japan, vol. 7, No. 40 (E-159)(1185) Feb. 17, 1983 & JP-A-57 193031 (Tokyo Shibaura Denki) Nov. 27, 1982.
European Search Report dated Sep. 7, 1989.
Kawashima et al., "Investigation for Plating to Transparent Electrode", 72nd Tech. Conv., Sec. Metal Surface Eng., 1985.

Primary Examiner—Jose Dees
Attorney, Agent, or Firm—Staas & Halsey

[57] ABSTRACT

An X-ray exposure mask provided, including an electrically conductive layer being translucent to an X-ray beam and a light beam, a gold layer formed on the electrically conductive layer, in a thickness so as to be translucent to the X-ray beam and the light beam, for forming a plating base in combination with the electrically conductive layer; a stencil being translucent to the X-ray beam and the light beam and partially formed on the electrically conductive layer so as to have patterns for forming a microscopic patterns onto a semiconductor wafer; and a gold X-ray absorber plated on the plating base for filling apertures of the stencil patterns. A mask alignment for the X-ray mask to the wafer is precisely executed by using the light beam passing through the stencil.

6 Claims, 4 Drawing Sheets

X-RAY EXPOSURE MASK

This is a continuation of co-pending application Ser. No. 010,543 filed on 2/3/87 now abandoned.

BACKGROUND OF THE INVENTION

The present invention relates to an X-ray exposure mask for forming microscopic patterns on a high density semiconductor device.

With a recent trend toward a high packing density of a semiconductor device, micro-patterning is normally used for fabricating the high density semiconductor device and advances are now being made in this area due to development of an X-ray exposing technology. The X-ray exposing technology is necessary to form a microscopic pattern onto a semiconductor wafer by exposing an X-ray beam, having a wavelength of several angstroms, to an X-ray resist material coated on the semiconductor wafer. When a light beam or an electron beam is used for patterning a microscopic pattern on the order of a submicron, for example diffraction, interference, and scatter of the light beam, or the electron beam, produces problems which reduce the resolution of the microscopic pattern. These problems are eliminated by applying the X-ray exposing technology.

Because the wavelength of an X-ray beam is very short, a conventional light exposure mask cannot be used in X-ray exposing technology. A X-ray exposure mask having a special structure for the X-ray beam is used, and the X-ray exposure mask will be called "an X-ray mask" hereinafter. Thus, the special mask is used for patterning the microscopic pattern by using the X-ray beam, however, the patterning is carried out in the same way as patterning for an ordinary semiconductor device. Moreover, many of the same patterns for fabricating a plurality of semiconductor chips are formed on a semiconductor wafer by using a patterning apparatus called "a stepper", and furthermore a plurality of patterns, having different patterns respectively, are stacked by repeating the patterning.

FIG. 1 is a schematic diagram of a plurality of chip patterns 101 formed on a semiconductor wafer 100. In order to stack a plurality of patterns having different shapes respectively, a plurality of X-ray masks respectively having different patterns are necessary.

FIG. 2 is a schematic diagram of an example of such an X-ray mask. Reference numeral 200 represents an X-ray mask and reference numeral 201 is a membrane supported by a ring frame 202, which will be simply called "ring" 202 hereinafter; and, the membrane 201 will be explained later. The reference numeral 203 is a pattern for the semiconductor chip formed on the membrane 201.

As an example, in FIG. 2 four patterns 203 are provided having the same shape and size, respectively. X-ray patterns obtained from the patterns 203, by using the X-ray beam, are sequentially exposed on the semiconductor wafer 100 as shown in FIG. 1. The hatched patterns 103 within a circle 102 in FIG. 1 indicate the patterns being exposed sequentially. The pattern 203 in FIG. 2 is used to form the chip pattern and several patterns, different from the pattern 203, are usually stacked in order to complete a semiconductor chip pattern. That is, the semiconductor chip patterns 101 are formed on the semiconductor wafer 100 by using additional masks each having the same structure as that of the mask 200, but having different mask patterns 203 which complete the semiconductor chip patterns by stacking the X-ray patterns 101 of the different mask patterns 203 at the same position. Particularly, this stacking of patterns 203 must be done accurately because each pattern 203 to be stacked is a microscopic pattern. Further, positioning of the X-ray masks 200 is very important and currently a light beam is preferred for positioning the X-ray masks 200.

Reference numeral 204 depicted in FIG. 2 indicates four mask positioning marks for such positioning. Dots 104 depicted in FIG. 1 are wafer positioning marks previously provided to the semiconductor wafer 100. Sequentially exposures of X-ray patterns by the different X-ray masks 200 onto the semiconductor wafer 100 are executed through positioning by sequentially aligning the mask positioning marks 204 on the X-ray masks 200 to the wafer positioning marks 104 on the semiconductor wafer 100, by using the light beam.

For executing positioning using the light beam, optical mask alignment technology utilizing the diffraction of the light beam is currently the most advanced technology, from the point of view of accuracy.

This optical mask alignment technology has been explained in detail in "Application of Zone Plates to Alignment in Microlithography" by M. Feldman et al. (J. Vac. Sci. Technol., Vol 19, Vo. 4, Nov./Dec. 1981). As explained in this document, the X-ray mask 200 must have the structure of a window, through which a light beam passes, around each mask positioning mark 204 in order to apply the optical mask alignment technology. Namely, a part of an incident light beam is reflected by a mask positioning mark 204, on the X-ray mask 200, however the remainder of the incident light beam reaches the wafer positioning mark 104 as previously marked on the semiconductor wafer 100, by passing through the window provided at the periphery of the mask positioning mark 204 and then is reflected by the wafer positioning mark 104. The light beam reflected by the wafer positioning mark 104 again passes through the window and is gathered in a light condensing system along with the light beam reflected by the mask positioning mark 204. The mask positioning mark 204 and the wafer positioning mark 104 are imaged in the light condensing system and compared with each other. Next the position of the X-ray mask 200 is moved, relative to the position of the semiconductor wafer 100 until the images are superimposed on each other. Thus, the positions of the X-ray mask 200 and the semiconductor wafer 100 are aligned.

Thus, the light beam is used for the mask alignment in the patterning process and the X-ray beam is used for the patterning in fabrication of the high density semiconductor device. Therefore, the material of the X-ray mask 200 must be translucent not only to the X-ray beam but also to the light beam because making only the window portion of the X-ray mask 200 translucent to the light beam is difficult in view of the cost and cost efficient is an advantage of the present invention.

As a substrate of the X-ray mask 200, a membrane 201 of a material having a good transmission characteristics for the X-ray beam, such as boron nitride (BN) having a small atomic number, is used. Namely, in the case where conventional substrates such as glass or quartz are used for the membrane 201, the X-ray beam cannot be used because these substrates have a low transmission factor for the X-ray. A BN membrane is translucent to the light beam as well as the X-ray beam because of being as thin as several microns. However, the membrane has low mechanical strength and cannot be independently maintained flat therefore the membrane is adhered to a ring frame 202 for support.

FIGS. 3(a)-3(f) are schematic diagrams which indicate a process for fabricating an X-ray mask 200 of the prior art. These figures may be understood, as the showing where the sectional view taken along the line A-A' of FIG. 2 is indicated, moreover a 205 wide space between two patterns 203 A-A, related to the line A-A' is eliminated.

The prior art X-ray mask 200 has been fabricated by the following process. (1) The BN membrane, is deposited, by a chemical vapor deposition (CVD) method, on a silicon wafer (Si wafer) which is adhered to a ring frame 3, which will be called "ring" hereinafter, made of material, such as PYREX or ceramics, having a small thermal expansion coefficient. (2) A side, on which the BN membrane, is not deposited, of an internal part of the Si wafer looking from the ring 3 is removed by etching. Thus, the BN membrane 1 is supported flat by a ring 3, as shown in FIG. 3(a). (3) Titanium, tantalum - gold - tantalum, gold, or platinum, etc. is sputtered to a thickness of about 400-500 angstroms on the BN membrane 1. The sputtered layer is a plating base 4, which is a base layer used for easily plating metal on the BN membrane 1. (4) A photo resist material of a polymeric resin, or an electron beam (EB) resist 5 is coated on the plating base 4 as shown in FIG. 3(b). (5) The photo resist or the EB resist 5, is exposed or written, by a light beam or an electron beam, respectively, and then developed, thereby forming a photo resist pattern or an EB resist pattern called a stencil 6 is formed, as shown in FIG. 3(c). (6) Metal of gold (Au) is plated on the plating base 4 by using the plating base 4 as an electrode, and an aperture of the stencil 6 is filled up with the Au layer 7 as shown in FIG. 3(d). The Au layer 7 is an absorber for the X-ray beam. (7) After the aperture of the stencil 6 is filled up with the Au layer 7, the stencil 6 is removed by an ashing process. (8) The plating base 4 appears, after the stencil 6 is removed, is removed by a reactive ion etching (RIE) method, using carbon tetrafluoride ($CF_4$) gas or a sputter etching method, using argon (Ar) gas. FIG. 3(e) indicates a state where the stencil 6 and the plating base 4 thereunder have been eliminated. The stencil 6 and the plating base 4 are eliminated in order to make the vicinity of the positioning marks 204, provided to the X-ray mask 200, translucent on the light beam for executing the mask alignment. (9) Finally, as shown in FIG. 3(f), whole faces of the Au layer 7 and the membrane 1 are coated with a protective thin layer 8, which is translucent to the X-ray beam and the light beam, and thereby a conventional X-ray mask 200 has been completed.

However, the X-ray mask of the prior art explained above requires the eliminating process of the stencil 6 and the plating base 4 thereunder, which produces a problem in that grooves which are formed among the Au layers 7, after eliminating the stencil 6 and the plating base 4, are too narrow. Thus the grooves are easily destroyed by the successive processing, so that some of the patterns provided by the grooves are deformed or eliminated, and some of the Au layers 7 will be peeled. Explaining in further detail, the Au layer 7 is required to have a height of 0.5-1 microns in order to absorb the X-ray, and the width of stencil 6 is 1 micron or less, for example 0.1-0.2 microns, so that patterns of the Au layer 7 have a high aspect ratio, resulting in the fabricating structure being easily damaged.

In view of solving the above problem, an X-ray mask has been developed by, wherein a material having a high transmission factor for the X-ray is used for the stencil, the plating base is thin enough to allow the X-ray to pass through and the stencil is not required to be eliminated (Japan Published Unexamined Patent Application No. 193031 (1982)). According to this method, polycrystalline silicon, silicon nitride, silicon oxide or a composite material thereof is used for the stencil. However in selecting the material to transmit the X-ray beam, the transmission factor for the light beam is not considered. Accordingly, the positioning marks which should be translucent to the light beam, in the vicinity thereof, cannot be provided on the X-ray mask.

Proving the mask positioning marks in an area far from the patterns for the chips, such as an area near 3, must be avoided because the ring positional errors due to thermal expansion existing between positioning marks and the chip patterns increase. The spaces 205 and positions for the mask positioning marks 204 in FIG. 2 are determined considering the above. However, since it is difficult to make only the vicinity of each mask positioning mark translucent to the light beam due to the cost, as mentioned before, the stencil 6 must be eliminated in the fabrication process of the prior art X-ray mask.

SUMMARY OF THE INVENTION

It is accordingly an object of the present invention to improve the structure of the X-ray mask and to enhance the fabrication yield of the X-ray mask and reliability, so that metal parts of the X-ray mask, which absorb the X-ray and microscopic patterns for chips formed by the narrow space between such metal portions, are not deformed or destroyed during the fabrication process of the X-ray mask, or during handling after fabrication.

It is another object of the present invention to enhance the quality of high density semiconductor devices and the fabrication yield by allowing the X-ray mask to absorb not only the X-ray but also a visible light beam, thus realizing high precision positioning alignment by using the visible light beam during use of the X-ray mask.

It is a further object of the present invention to lower the fabrication cost of the X-ray mask, and accordingly lower the cost a high density semiconductor device fabricated by the X-ray mask, by simplifying the fabrication process of the X-ray mask.

These and other objects of the present invention are achieved by applying material of Indium Tin Oxide (ITO), on which gold is sputtered to the plating base. The ITO is translucent to the X-ray beam and the light beam and is electrically conductive. Further, the sputtered gold thereon has a thickness between 1-67 angstroms so as to be translucent to the X-ray beam and the light beam.

DETAILED DESCRIPTION OF THE PREFERRED EMBODIMENTS

Figure 4A:
FIGS. 4(a)–4(h) are schematic diagrams indicating a fabrication process of one X-ray mask of an embodiment of the present invention.
Figure 4B:
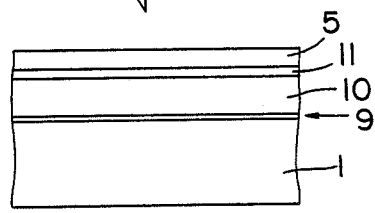
Figure 4C:
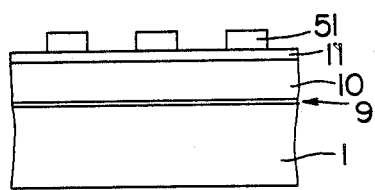
Figure 4D:
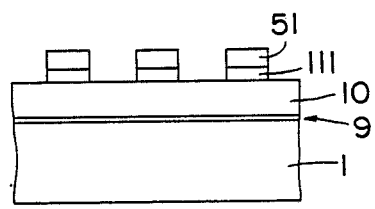
Figure 4E:
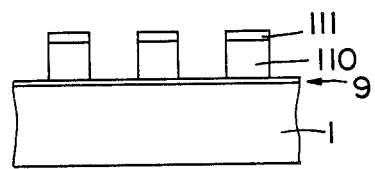
Figure 4F:
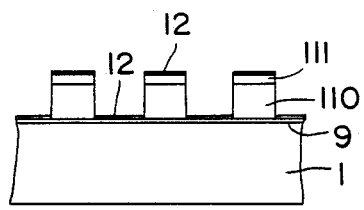
Figure 4G:
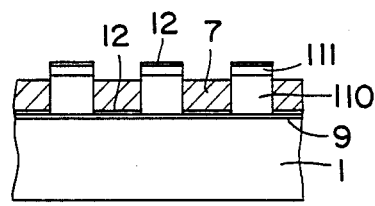
Figure 4H:
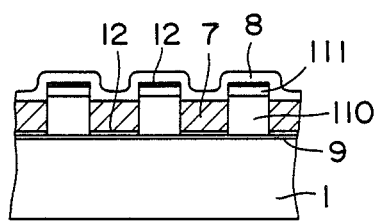

FIGS. 4(a)–4(h) indicate partial cross-sectional views of a fabrication steps of an X-ray mask embodying the present invention, in which FIG. 4(h) indicates the structure of the X-ray mask of the present invention.

As shown in FIG. 4(h), the structure of the X-ray mask of the present invention includes the following parts: a membrane 1, which is a mask substrate made of material, such as boron nitride (BN), being translucent to an X-ray beam and a light beam; an electrically conductive layer 9 sputtered on the membrane 1 and made of material, such as Indium Tin Oxide (ITO), being electrically conductive and translucent to the X-ray beam and the light beam; a stencil, arranged in a pattern for forming the semiconductor chip patterns onto the semiconductor wafer, where each part of the stencil includes a remaining polymer part 110 which is coated on the electrically conductive layer 9 and is translucent to the X-ray beam and the light beam; and an X-ray absorber 7 made of gold which fills an aperture of the pattern of the stencil.

Wherein, each part of the stencil further includes a remaining inorganic part 111 which is made of inorganic material such as silicon dioxide and sputtered on the remaining polymer part 110, and a thin gold layer 12 is sputtered on the remaining inorganic part 111. However, the remaining inorganic part 111 and the thin gold layer 12 are translucent not only to the X-ray beam but also to the light beam, so that accurate mask alignment can be executed by using the light beam passing therethrough. The thin gold layer 12 is also sputtered on the electrically conductive layer 9, the purpose being that the sputtering of the thin gold layer 12 forms a plating base in combination with the electrically conductive layer 9, for plating the X-ray absorber 7. A thickness of the thin gold layer 12 is delicate and the thickness should be more than one angstrom for executing the plating and less than sixty-seven angstroms for passing the light beam therethrough to execute the mask alignment.

Figure 1:
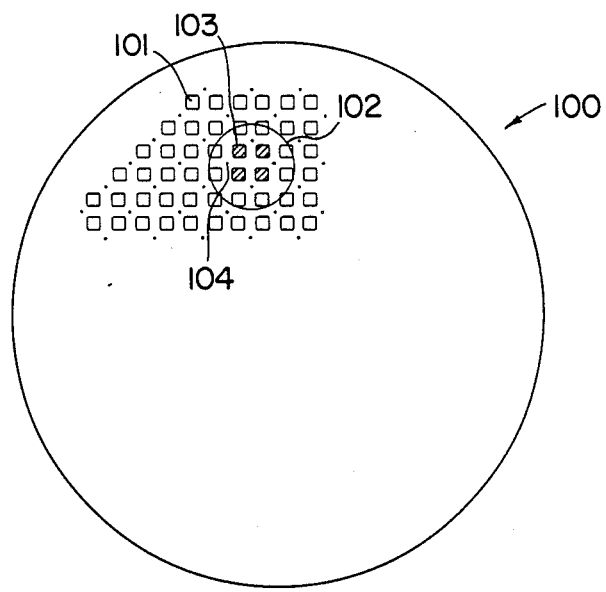
FIG. 1 is a schematic diagram indicating a plurality of chip patterns and wafer positioning marks formed on a semiconductor wafer.
Figure 2:
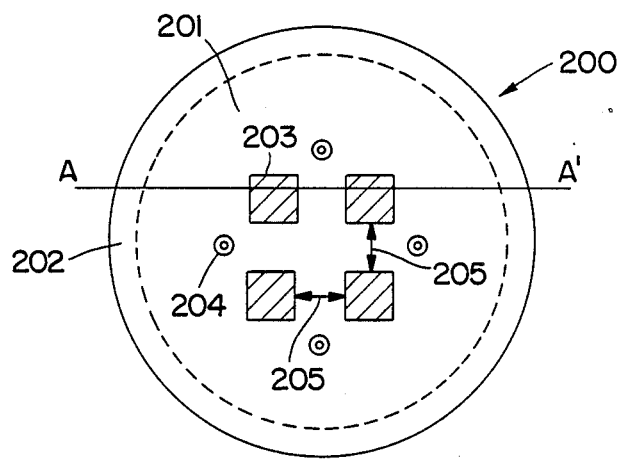
FIG. 2 is a schematic diagram of an X-ray mask depicting patterns for the chips and mask positioning marks.
Figure 3A:
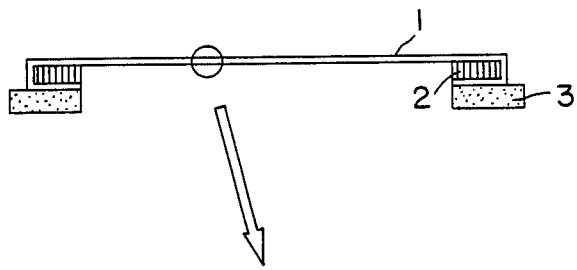
FIGS. 3(a)-3(f) are schematic diagrams indicating the steps in the fabrication process of an X-ray mask of the prior art.
Figure 3B:
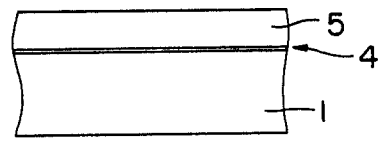
Figure 3C:
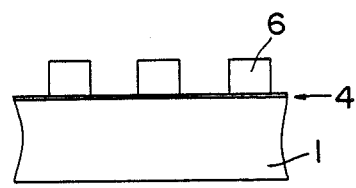
Figure 3D:
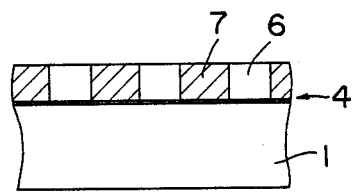
Figure 3E:
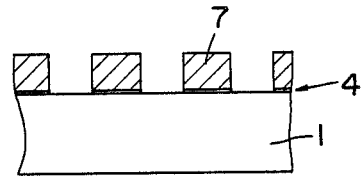
Figure 3F:
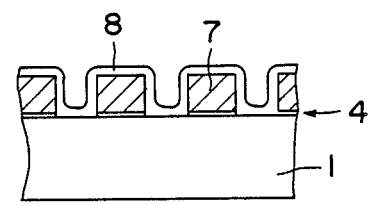

A fabrication process of the X-ray mask of the present invention is as follows. (1) Providing a membrane 1 made of BN, being translucent to the X-ray beam and the light beam and supported by a ring 3 made of PYREX or ceramics through a silicon ring 2, as shown in FIG. 4(a). This process is the same as that stated in the explanation of the prior art X-ray mask of FIG. 3(a). (2) As shown in FIG. 4(b), Indium Tin Oxide (ITO) is sputtered on the membrane 1 in a thickness between 300 and 3,000 angstroms to form an electrically conductive layer 9. The ITO mixture contains 5 to 20% tin oxide ($SiO_2$) the remainder being indium oxide ($In_2O_3$). The ITO is not only electrically conductive but also translucent to the X-ray beam and the light beam. Polymer, such as polyamide, is sputtered on the electrically conductive layer 9 in the thickness of 1 to 2 microns, when polyimide is used, to form a polymer layer 10, and inorganic material, such as silicon dioxide ($SiO_2$), is sputtered on the polymer layer 10 in the thickness of 500 to 2000 angstroms to form an inorganic layer 11. Then, electron beam (EB) resist material is spin-coated on the inorganic layer 11, in the thickness of 1000 to 5000 angstroms, to form an EB resist layer 5, wherein a photo resist can be used instead of the EB resist. (3) patterns for the semiconductor chips on the EB resist 5 are written by using an electron beam and developing the EB resist 5, so that remaining EB resists 51 are left, as shown in FIG. 4 (c). (4) The inorganic layer 11 is etched by applying the RIE method using trifluoromethane ($CHF_3$) gas and $CF_4$ gas being used when the inorganic layer 11 is made of silicon dioxide, so that the remaining inorganic part 111 is left under each remaining resist 51, as shown in FIG. 4(d). (5) The polymer layer 10 is etched by applying the RIE method using the dioxide ($O_2$) gas when the polymer layer 10 is made of polyimide, so that remaining polymer parts 110 are left. In this case, each remaining EB resist 51 is also etched and FIG. 4(e) is obtained. In FIG. 4(e), the remaining polymer parts 110 and the remaining inorganic parts 111 form a stencil. (6) Au is sputtered on the whole surface of the mask being fabricated in the thickness between 1 and 67 angstroms, to obtain an Au thin layer 12, as shown in FIG. 4(f). When a thickness of the Au layer 12 is 67 angstroms, the transmitting factor for the X-ray beam is negligible, and the light beam transmission factor (strictly, the He-He laser beam) becomes 30%, which is an approximate limit value for executing the mask alignment. The value of 67A is not a strict value and a small increase may be allowed. The Au layer 12 sputtered on the electrically conductive layer 9 other than the stencil part becomes a plating base for plating metal of Au in the next process. (7) Metal of Au is plated on the plating base using the plating base as an electrode, to form an X-ray absorber 7, so that an aperture of the stencil is filled with the X-ray absorber 7. (8) Finally, the protection layer 8, which is translucent to the X-ray beam and the light beam is coated on all faces of the stencil and the X-ray absorber 7, as shown in FIG. 4(h), so that the X-ray mask of the present invention is completed.

As mentioned above, applying the present invention to an fabrication of the X-ray mask, the process required for removing the stencil is eliminated and, since the stencil is not removed, the X-ray absorber 7 is not likely to be bent or damaged, thereby the reliability of the X-ray mask is improved. Moreover, since the stencil is translucent not only to the X-ray beam but also to the light beam, the high precision mask alignment can be realized by using the light beam. Although certain preferred embodiments have been shown and described, it should be understood that many changes and modifications may be made therein without departing from the scope of the appended claims.

What is claimed is:

1. An X-ray exposure mask for patterning a semiconductor wafer with semiconductor chip patterns by using an X-ray beam, a position of the mask relative to the semiconductor wafer being aligned during patterning by using a light beam, said exposure mask comprising:
    (a) a mask substrate which is translucent to the X-ray beam and the light beam;
    (b) an electrically conductive layer disposed on said mask substrate, being translucent to the X-ray beam and the light beam;
    (c) stencil means, formed on said electrically conductive layer, as patterns located on first parts of the electrically conductive layer and apertures therebetween located on second parts of the electrically conductive layer, for forming the semiconductor chip patterns on the semiconductor wafer by passing the X-ray beam through said stencil means, said stencil means being translucent to the light beam for executing the alignment of the exposure mask to the semiconductor wafer;

(d) a metal layer, a first portion of which is formed on the second, parts of said electrically conductive layer, and a second portion of which is formed on said stencil means, each portion being in the thickness range of greater than 1 but less than 67 angstroms and being translucent to the X-ray beam and the light beam, said first portion providing a plating base by combining with said second parts of said electrically conductive layer and said second portion allowing the X-ray beam and the light beam to pass therethrough; and (e) X-ray absorption means formed on said first portion of said metal layer in the apertures of said patterns of said stencil means for forming the semiconductor chip patterns on the semiconductor wafer by absorbing the X-ray beam.

2. An X-ray exposure mask according to claim 1, wherein said electrically conductive layer includes material of indium tin oxide having indium oxide and tin oxide.

3. An X-ray exposure mask according to claim 2, wherein said stencil means include polymer portion.

4. An X-ray exposure mask according to claim 3, wherein said metal layer includes gold material.

5. An X-ray exposure mask according to claim 4, wherein said X-ray absorption means includes gold material.

6. A method for fabricating an X-ray exposure mask used for patterning a semiconductor wafer with semiconductor chip patterns by using an X-ray beam, a position of the exposure mask relative to the semiconductor wafer being aligned during patterning by using a light beam, said method comprising the steps of:

(a) providing a mask substrate being translucent to the X-ray beam and the light beam;
(b) forming an electrically conductive layer, being translucent to the X-ray beam and the light beam, on said mask substrate;
(c) forming a polymer layer on said electrically conductive layer;
(d) forming an inorganic layer on said polymer layer;
(e) forming a resist on said inorganic layer;
(f) writing mask patterns, which are to form the semiconductor chip patterns on the semiconductor wafer, by an electron beam onto said resist;
(g) developing said resist to form a stencil as patterns located on first parts of the electrically conductive layer and apertures therebetween located on second parts of the electrically conductive layer, for forming the semiconductor chip patterns on the semiconductor wafer;
(h) etching said inorganic layer;
(i) etching said polymer layer;
(j) forming a gold layer, a first portion of which is formed on said second parts of said electrically conductive layer and a second portion of which is formed on said stencil, each portion formed in the range of greater than 1 and less than 67 angstroms to be translucent to the X-ray beam and the light beam, said first portion forming a plating base in combination with said second parts of said electrically conductive layer and said second portion allowing the X-ray and light beam to pass therethrough; and
(k) plating gold on said plating base so as to fill the apertures of said patterns of said stencil using said plating base as an electrode for the plating.

* * * * *